United States Patent
Kim

(10) Patent No.: US 10,515,673 B2
(45) Date of Patent: Dec. 24, 2019

(54) SEMICONDUCTOR DEVICES AND SEMICONDUCTOR SYSTEMS INCLUDING A SEMICONDUCTOR DEVICE

(71) Applicant: SK hynix Inc., Icheon-si, Gyeonggi-do (KR)

(72) Inventor: Kwandong Kim, Cheongju-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/117,633

(22) Filed: Aug. 30, 2018

(65) Prior Publication Data

US 2019/0267051 A1    Aug. 29, 2019

(30) Foreign Application Priority Data

Feb. 28, 2018   (KR) .................. 10-2018-0024195

(51) Int. Cl.
*G11C 7/10*    (2006.01)

(52) U.S. Cl.
CPC .............. *G11C 7/1051* (2013.01); *G11C 7/10* (2013.01); *G11C 7/1015* (2013.01); *G11C 7/1018* (2013.01)

(58) Field of Classification Search
CPC ........ G11C 7/1051; G11C 7/1018; G11C 7/10
See application file for complete search history.

(56) References Cited

U.S. PATENT DOCUMENTS

| | | | |
|---|---|---|---|
| 6,442,716 B1* | 8/2002 | Kim ................... | G11C 7/1051 365/201 |
| 7,269,212 B1 | 9/2007 | Chau et al. | |
| 2002/0176309 A1* | 11/2002 | Kwak ................ | G11C 7/1051 365/230.05 |
| 2003/0095442 A1* | 5/2003 | Lee .................... | G11C 7/1012 365/189.02 |
| 2010/0002529 A1* | 1/2010 | Kim ................... | G11C 7/1051 365/189.15 |
| 2010/0315887 A1* | 12/2010 | Park ................... | G11C 7/1051 365/189.07 |
| 2013/0315007 A1* | 11/2013 | Cha .................... | G11C 29/34 365/189.07 |

(Continued)

FOREIGN PATENT DOCUMENTS

KR      20090025735 A      3/2009

*Primary Examiner* — Khamdan N. Alrobaie
(74) *Attorney, Agent, or Firm* — William Park & Associates Ltd.

(57) ABSTRACT

A semiconductor device includes a memory circuit and a data output circuit. The memory circuit outputs first internal data having a first burst length in a first mode and outputs the first internal data and second internal data in a second mode. A sum of the first and second internal data has a second burst length. The data output circuit outputs the first internal data as first output data through a first input/output line in the first mode. The data output circuit outputs the first internal data as the first output data through the first I/O line and outputs the second internal data as second output data through a second I/O line in the second mode. The data output circuit controls an internal current according to a logic level combination of the first and second internal data to generate the first and second output data in the second mode.

29 Claims, 9 Drawing Sheets

(56) References Cited

U.S. PATENT DOCUMENTS

| | | | |
|---|---|---|---|
| 2015/0263704 A1* | 9/2015 | Lee | H04L 25/028 327/306 |
| 2016/0172012 A1* | 6/2016 | Lim | G11C 7/20 365/189.05 |
| 2019/0066806 A1* | 2/2019 | Chat | G11C 16/32 |

* cited by examiner

FIG. 8

| | CMP1 | CMP2 | CMP3 | DO1<1> | DO2<1> |
|---|---|---|---|---|---|
| FIRST SECTION | L | L | L | L | L |
| SECOND SECTION | H | L | L | L | H |
| THIRD SECTION | H | H | L | H | L |
| FOURTH SECTION | H | H | H | H | H |

US 10,515,673 B2

SEMICONDUCTOR DEVICES AND SEMICONDUCTOR SYSTEMS INCLUDING A SEMICONDUCTOR DEVICE

CROSS-REFERENCE TO RELATED APPLICATIONS

The present application claims priority under 35 U.S.C 119(a) to Korean Application No. 10-2018-0024195, filed on Feb. 28, 2018, which is incorporated herein by reference in its entirety.

BACKGROUND

1. Technical Field

Embodiments of the present disclosure generally relate to semiconductor devices and semiconductor systems and, more particularly, to semiconductor devices relating to outputting data through input/output (I/O) lines shared in a first mode and a second mode having different burst lengths.

2. Related Art

Semiconductor devices have been continuously developed to operate at high speeds. As a result, the semiconductor devices have been designed to receive and output the data in synchronization with an external clock signal. A burst operation corresponds to a typical operation for receiving and outputting the data in synchronization with an external clock signal. According to the burst operation, the semiconductor device may successively receive or output a plurality of data corresponding to a burst length in response to a single write command or a single read command if the burst length is set by a mode register set (MRS).

The burst length (BL), which is set for the burst operation, may have any one of various values such as four, eight and sixteen. If the burst length (BL) is set to be eight (i.e., BL=8), "8"-bit data may be successively (or simultaneously) inputted to or outputted from the semiconductor device by a single write command or a single read command. In addition, the semiconductor device my control a mode for changing the burst length to operate in a "×4" mode having a burst length of four, a "×8" mode having a burst length of eight, or a "×16" mode having a burst length of sixteen. The burst length may relate to a bit organization of the semiconductor device.

SUMMARY

According to an embodiment, a semiconductor device may include a memory circuit and a data output circuit. The memory circuit may be configured to output first internal data having a first burst length in a first mode and output the first internal data and second internal data in a second mode. A sum of the first and second internal data has a second burst length. The data output circuit may be configured to output the first internal data as first output data through a first input/output (I/O) line in the first mode. In addition, the data output circuit may be configured to output the first internal data as the first output data through the first I/O line and output the second internal data as second output data through a second I/O line in the second mode. The data output circuit may be configured to control an internal current according to a logic level combination of the first and second internal data to generate the first and second output data in the second mode.

According to an embodiment, a semiconductor system may include a first semiconductor device and a second semiconductor device. The first semiconductor device may be configured to output a first mode signal and a second mode signal and receive data loaded on a first input/output (I/O) line and a second I/O line. The second semiconductor device may be configured to output first internal data as first output data through the first I/O line based on the first mode signal. In addition, the second semiconductor device may be configured to output the first internal data as the first output data through the first I/O line and output second internal data as second output data through the second I/O line based on the second mode signal. The second semiconductor device may be configured to control an internal current according to a logic level combination of the first and second internal data to generate the first and second output data, if the second mode signal is enabled.

BRIEF DESCRIPTION OF THE DRAWINGS

FIGS. 7 and 8 are a graph and a table illustrating an operation of a semiconductor system according to an embodiment of the present disclosure.

DETAILED DESCRIPTION

Various embodiments of the present disclosure will be described hereinafter with reference to the accompanying drawings. However, the embodiments described herein are for illustrative purposes only and are not intended to limit the scope of the present disclosure.

Figure 1:
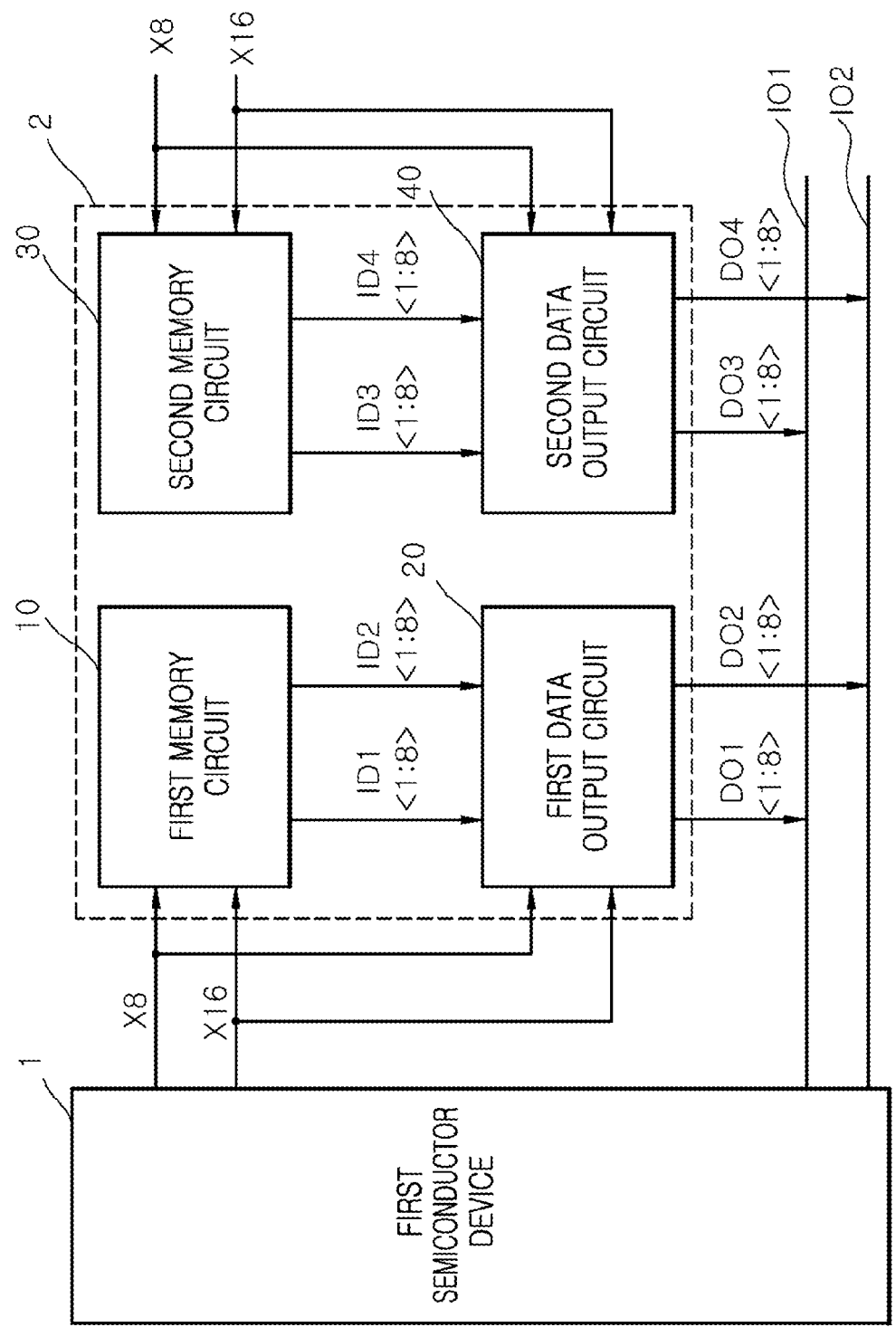
FIG. 1 is a block diagram illustrating a configuration of a semiconductor system according to an embodiment of the present disclosure.

Referring to FIG. 1, a semiconductor system according to an embodiment may include a first semiconductor device 1 and a second semiconductor device 2.

The first semiconductor device 1 may output a first mode signal 'x8' and a second mode signal 'x16'. The first semiconductor device 1 may receive data loaded on a first input/output (I/O) line IO1 and a second input/output (I/O) line 102. The first semiconductor device 1 may receive first output data DO1<1:8> and third output data DO3<1:8> loaded on the first I/O line IO1. The first semiconductor device 1 may receive second output data DO2<1:8> and fourth output data DO4<1:8> loaded on the second I/O line 102. The first mode signal 'x8' may be enabled to activate a first mode having a burst length of eight corresponding to the number of data which are outputted from the second semiconductor device 2 at a time during a read operation. The second mode signal 'x16' may be enabled to activate a second mode having a burst length of sixteen corresponding to the number of data which are outputted from the second semiconductor device 2 at a time during a read operation. The burst lengths of the first mode signal 'x8' and the second mode signal 'x16' may be set to be different according to the embodiments. The first semiconductor device 1 may be a controller or a test apparatus that controls an operation of the second semiconductor device 2.

The second semiconductor device 2 may include a first memory circuit 10, a first data output circuit 20, a second memory circuit 30 and a second data output circuit 40.

The first memory circuit 10 may output first internal data ID1<1:8> having a first burst length (BL8) in a first mode. The first memory circuit 10 may output the first internal data ID1<1:8> having the first burst length (BL8) in response to the first mode signal 'x8'. The first memory circuit 10 may output the first internal data ID1<1:8> and second internal data ID2<1:8>, a sum of which has a second burst length (BL16), in a second mode. The first memory circuit 10 may output the first internal data ID1<1:8> and the second internal data ID2<1:8>, a sum of which has the second burst length (BL16), in response to the second mode signal 'x16'. The first memory circuit 10 may be realized using a general memory circuit that stores data therein and outputs the stored data. The first internal data ID1<1:8> and the second internal data ID2<1:8> may be outputted through a global line corresponding to an internal I/O line included in the second semiconductor device 2.

The first data output circuit 20 may output the first internal data ID1<1:8> as the first output data DO1<1:8> in the first mode. The first data output circuit 20 may output the first internal data ID1<1:8> as the first output data DO1<1:8> in response to the first mode signal 'x8'. The first data output circuit 20 may output the first internal data ID1<1:8> as the first output data DO1<1:8> and may output the second internal data ID2<1:8> as the second output data DO2<1:8>, in the second mode. The first data output circuit 20 may output the first internal data ID1<1:8> as the first output data DO1<1:8> and may output the second internal data ID2<1:8> as the second output data DO2<1:8>, in response to the second mode signal 'x16'. The first output data DO1<1:8> may be transmitted to the first semiconductor device 1 through the first I/O line IO1. The second output data DO2<1:8> may be transmitted to the first semiconductor device 1 through the second I/O line IO2.

The second memory circuit 30 may output third internal data ID3<1:8> having the first burst length (BL8) in the first mode. The second memory circuit 30 may output the third internal data ID3<1:8> having the first burst length (BL8) in response to the first mode signal 'x8'. The second memory circuit 30 may output the third internal data ID3<1:8> and fourth internal data ID4<1:8>, a sum of which has the second burst length (BL16), in the second mode. The second memory circuit 30 may output the third internal data ID3<1:8> and the fourth internal data ID4<1:8>, a sum of which has the second burst length (BL16), in response to the second mode signal 'x16'. The second memory circuit 30 may be realized using a general memory circuit that stores data therein and outputs the stored data. The third internal data ID3<1:8> and the fourth internal data ID4<1:8> may be outputted through a global line corresponding to an internal I/O line included in the second semiconductor device 2.

The second data output circuit 40 may output the third internal data ID3<1:8> as the third output data DO3<1:8> in the first mode. The second data output circuit 40 may output the third internal data ID3<1:8> as the third output data DO3<1:8> in response to the first mode signal 'x8'. The second data output circuit 40 may output the third internal data ID3<1:8> as the third output data DO3<1:8> and may output the fourth internal data ID4<1:8> as the fourth output data DO4<1:8>, in the second mode. The second data output circuit 40 may output the third internal data ID3<1:8> as the third output data DO3<1:8> and may output the fourth internal data ID4<1:8> as the fourth output data DO4<1:8>, in response to the second mode signal 'x16'. The third output data DO3<1:8> may be transmitted to the first semiconductor device 1 through the first I/O line IO1. The fourth output data DO4<1:8> may be transmitted to the first semiconductor device 1 through the second I/O line IO2. The first output data DO1<1:8> and the third output data DO3<1:8> may be transmitted to the first semiconductor device 1 through the first I/O line IO1 at two different moments, respectively. The second output data DO2<1:8> and the fourth output data DO4<1:8> may be transmitted to the first semiconductor device 1 through the second I/O line IO2 at two different moments, respectively.

As described above, the second semiconductor device 2 may output the first internal data ID1<1:8> as the first output data DO1<1:8> through the first I/O line IO1 in the first mode. The second semiconductor device 2 may output the third internal data ID3<1:8> as the third output data DO3<1:8> through the first I/O line IO1 in the first mode. The second semiconductor device 2 may output the first internal data ID1<1:8> as the first output data DO1<1:8> through the first I/O line IO1 and may output the second internal data ID2<1:8> as the second output data DO2<1:8> through the second I/O line IO2, in the second mode. The second semiconductor device 2 may control an internal current according to a logic level combination of the first internal data ID1<1:8> and the second internal data ID2<1:8> in the second mode. The second semiconductor device 2 may generate the first output data DO1<1:8> and the second output data DO2<1:8> according to the controlled internal current. The second semiconductor device 2 may output the first and second output data DO1<1:8> and DO2<1:8> to the first semiconductor device 1. The second semiconductor device 2 may output the third internal data ID3<1:8> as the third output data DO3<1:8> through the first I/O line IO1 and may output the fourth internal data ID4<1:8> as the fourth output data DO4<1:8> through the second I/O line IO2, in the second mode. The second semiconductor device 2 may control the internal current according to a logic level combination of the third internal data ID3<1:8> and the fourth internal data ID4<1:8> in the second mode. The second semiconductor device 2 may generate the third output data DO3<1:8> and the fourth output data DO4<1:8> according to the controlled internal current. The second semiconductor device 2 may output the third and fourth output data DO3<1:8> and DO4<1:8> to the first semiconductor device 1.

The second semiconductor device 2 may be realized using a volatile memory device or a nonvolatile memory device that is controlled by the first semiconductor device 1 to perform a write operation and a read operation.

Figure 2:
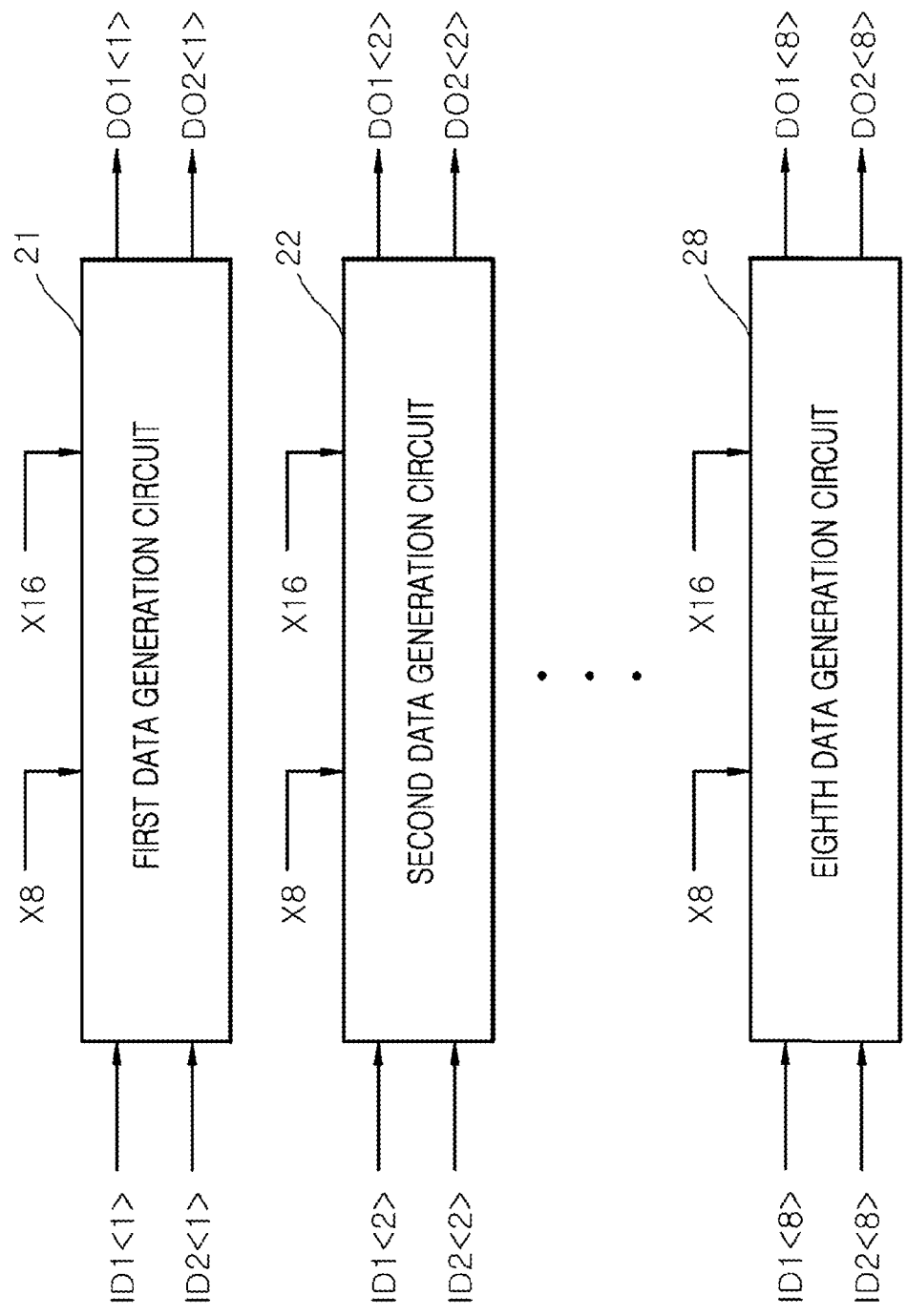
FIG. 2 is a block diagram illustrating a configuration of a first data output circuit included in a second semiconductor device of the semiconductor system illustrated in FIG. 1.

Referring to FIG. 2, the first data output circuit 20 may include first to eighth data generation circuits 21, 22, . . . and 28.

The first data generation circuit 21 may output a first bit datum ID1<1> of the first internal data ID1<1:8> as a first bit datum DO1<1> of the first output data DO1<1:8> in the first mode. The first data generation circuit 21 may output the first bit datum ID1<1> of the first internal data ID1<1:8> as the first bit datum DO1<1> of the first output data DO1<1:8> in response to the first mode signal 'x8'. The first data generation circuit 21 may generate the first bit datum DO1<1> of the first output data DO1<1:8> and a first bit datum DO2<1> of the second output data DO2<1:8> according to a logic level combination of the first bit datum ID1<1> of the first internal data ID1<1:8> and a first bit datum ID2<1> of the second internal data ID2<1:8>, in the second mode. The first data generation circuit 21 may generate the first bit datum DO1<1> of the first output data DO1<1:8> and the first bit datum DO2<1> of the second output data DO2<1:8> according to a logic level combination of the first bit datum ID1<1> of the first internal data ID1<1:8> and the first bit datum ID2<1> of the second internal data ID2<1:8>, in response to the second mode signal 'x16'.

The second data generation circuit 22 may output a second bit datum ID1<2> of the first internal data ID1<1:8> as a second bit datum DO1<2> of the first output data DO1<1:8> in the first mode. The second data generation circuit 22 may output the second bit datum ID1<2> of the first internal data ID1<1:8> as the second bit datum DO1<2> of the first output data DO1<1:8> in response to the first mode signal 'x8'. The second data generation circuit 22 may generate the second bit datum DO1<2> of the first output data DO1<1:8> and a second bit datum DO2<2> of the second output data DO2<1:8> according to a logic level combination of the second bit datum ID1<2> of the first internal data ID1<1:8> and a second bit datum ID2<2> of the second internal data ID2<1:8>, in the second mode. The second data generation circuit 22 may generate the second bit datum DO1<2> of the first output data DO1<1:8> and the second bit datum DO2<2> of the second output data DO2<1:8> according to a logic level combination of the second bit datum ID1<2> of the first internal data ID1<1:8> and the second bit datum ID2<2> of the second internal data ID2<1:8>, in response to the second mode signal 'x16'.

The third data generation circuit (not illustrated) may output a third bit datum ID1<3> of the first internal data ID1<1:8> as a third bit datum DO1<3> of the first output data DO1<1:8> in the first mode. The third data generation circuit (not illustrated) may output the third bit datum ID1<3> of the first internal data ID1<1:8> as the third bit datum DO1<3> of the first output data DO1<1:8> in response to the first mode signal 'x8'. The third data generation circuit (not illustrated) may generate the third bit datum DO1<3> of the first output data DO1<1:8> and a third bit datum DO2<3> of the second output data DO2<1:8> according to a logic level combination of the third bit datum ID1<3> of the first internal data ID1<1:8> and a third bit datum ID2<3> of the second internal data ID2<1:8>, in the second mode. The third data generation circuit (not illustrated) may generate the third bit datum DO1<3> of the first output data DO1<1:8> and the third bit datum DO2<3> of the second output data DO2<1:8> according to a logic level combination of the third bit datum ID1<3> of the first internal data ID1<1:8> and the third bit datum ID2<3> of the second internal data ID2<1:8>, in response to the second mode signal 'x16'.

The fourth data generation circuit (not illustrated) may output a fourth bit datum ID1<4> of the first internal data ID1<1:8> as a fourth bit datum DO1<4> of the first output data DO1<1:8> in the first mode. The fourth data generation circuit (not illustrated) may output the fourth bit datum ID1<4> of the first internal data ID1<1:8> as the fourth bit datum DO1<4> of the first output data DO1<1:8> in response to the first mode signal 'x8'. The fourth data generation circuit (not illustrated) may generate the fourth bit datum DO1<4> of the first output data DO1<1:8> and a fourth bit datum DO2<4> of the second output data DO2<1:8> according to a logic level combination of the fourth bit datum ID1<4> of the first internal data ID1<1:8> and a fourth bit datum ID2<4> of the second internal data ID2<1:8>, in the second mode. The fourth data generation circuit (not illustrated) may generate the fourth bit datum DO1<4> of the first output data DO1<1:8> and the fourth bit datum DO2<4> of the second output data DO2<1:8> according to a logic level combination of the fourth bit datum ID1<4> of the first internal data ID1<1:8> and the fourth bit datum ID2<4> of the second internal data ID2<1:8>, in response to the second mode signal 'x16'.

The fifth data generation circuit (not illustrated) may output a fifth bit datum ID1<5> of the first internal data ID1<1:8> as a fifth bit datum DO1<5> of the first output data DO1<1:8> in the first mode. The fifth data generation circuit (not illustrated) may output the fifth bit datum ID1<5> of the first internal data ID1<1:8> as the fifth bit datum DO1<5> of the first output data DO1<1:8> in response to the first mode signal 'x8'. The fifth data generation circuit (not illustrated) may generate the fifth bit datum DO1<5> of the first output data DO1<1:8> and a fifth bit datum DO2<5> of the second output data DO2<1:8> according to a logic level combination of the fifth bit datum ID1<5> of the first internal data ID1<1:8> and a fifth bit datum ID2<5> of the second internal data ID2<1:8>, in the second mode. The fifth data generation circuit (not illustrated) may generate the fifth bit datum DO1<5> of the first output data DO1<1:8> and the fifth bit datum DO2<5> of the second output data DO2<1:8> according to a logic level combination of the fifth bit datum ID1<5> of the first internal data ID1<1:8> and the fifth bit datum ID2<5> of the second internal data ID2<1:8>, in response to the second mode signal 'x16'.

The sixth data generation circuit (not illustrated) may output a sixth bit datum ID1<6> of the first internal data ID1<1:8> as a sixth bit datum DO1<6> of the first output data DO1<1:8> in the first mode. The sixth data generation circuit (not illustrated) may output the sixth bit datum ID1<6> of the first internal data ID1<1:8> as the sixth bit datum DO1<6> of the first output data DO1<1:8> in response to the first mode signal 'x8'. The sixth data generation circuit (not illustrated) may generate the sixth bit datum DO1<6> of the first output data DO1<1:8> and a sixth bit datum DO2<6> of the second output data DO2<1:8> according to a logic level combination of the sixth bit datum ID1<6> of the first internal data ID1<1:8> and a sixth bit datum ID2<6> of the second internal data ID2<1:8>, in the second mode. The sixth data generation circuit (not illustrated) may generate the sixth bit datum DO1<6> of the first output data DO1<1:8> and the sixth bit datum DO2<6> of the second output data DO2<1:8> according to a logic level combination of the sixth bit datum ID1<6> of the first internal data ID1<1:8> and the sixth bit datum ID2<6> of the second internal data ID2<1:8>, in response to the second mode signal 'x16'.

The seventh data generation circuit (not illustrated) may output a seventh bit datum ID1<7> of the first internal data ID1<1:8> as a seventh bit datum DO1<7> of the first output data DO1<1:8> in the first mode. The seventh data generation circuit (not illustrated) may output the seventh bit datum ID1<7> of the first internal data ID1<1:8> as the seventh bit datum DO1<7> of the first output data DO1<1:8> in response to the first mode signal 'x8'. The seventh data generation circuit (not illustrated) may generate the seventh bit datum DO1<7> of the first output data DO1<1:8> and a seventh bit datum DO2<7> of the second output data DO2<1:8> according to a logic level combination of the seventh bit datum ID1<7> of the first internal data ID1<1:8> and a seventh bit datum ID2<7> of the second internal data ID2<1:8>, in the second mode. The seventh data generation circuit (not illustrated) may generate the seventh bit datum DO1<7> of the first output data DO1<1:8> and the seventh bit datum DO2<7> of the second output data DO2<1:8> according to a logic level combination of the seventh bit datum ID1<7> of the first internal data ID1<1:8> and the seventh bit datum ID2<7> of the second internal data ID2<1:8>, in response to the second mode signal 'x16'.

The eighth data generation circuit 28 may output an eighth bit datum ID1<8> of the first internal data ID1<1:8> as an eighth bit datum DO1<8> of the first output data DO1<1:8> in the first mode. The eighth data generation circuit 28 may output the eighth bit datum ID1<8> of the first internal data ID1<1:8> as the eighth bit datum DO1<8> of the first output data DO1<1:8> in response to the first mode signal 'x8'. The eighth data generation circuit 28 may generate the eighth bit datum DO1<8> of the first output data DO1<1:8> and an eighth bit datum DO2<8> of the second output data DO2<1:8> according to a logic level combination of the eighth bit datum ID1<8> of the first internal data ID1<1:8> and an eighth bit datum ID2<8> of the second internal data ID2<1:8>, in the second mode. The eighth data generation circuit 28 may generate the eighth bit datum DO1<8> of the first output data DO1<1:8> and the eighth bit datum DO2<8> of the second output data DO2<1:8> according to a logic level combination of the eighth bit datum ID1<8> of the first internal data ID1<1:8> and the eighth bit datum ID2<8> of the second internal data ID2<1:8>, in response to the second mode signal 'x16'.

The second data output circuit 40 illustrated in FIG. 1 may be realized using the same circuit as the first data output circuit 20 described with reference to FIG. 2 except input/output (I/O) signals. Thus, since the second data output circuit 40 performs substantially the same operation as the first data output circuit 20, a detailed description of the second data output circuit 40 will be omitted hereinafter.

Figure 3:
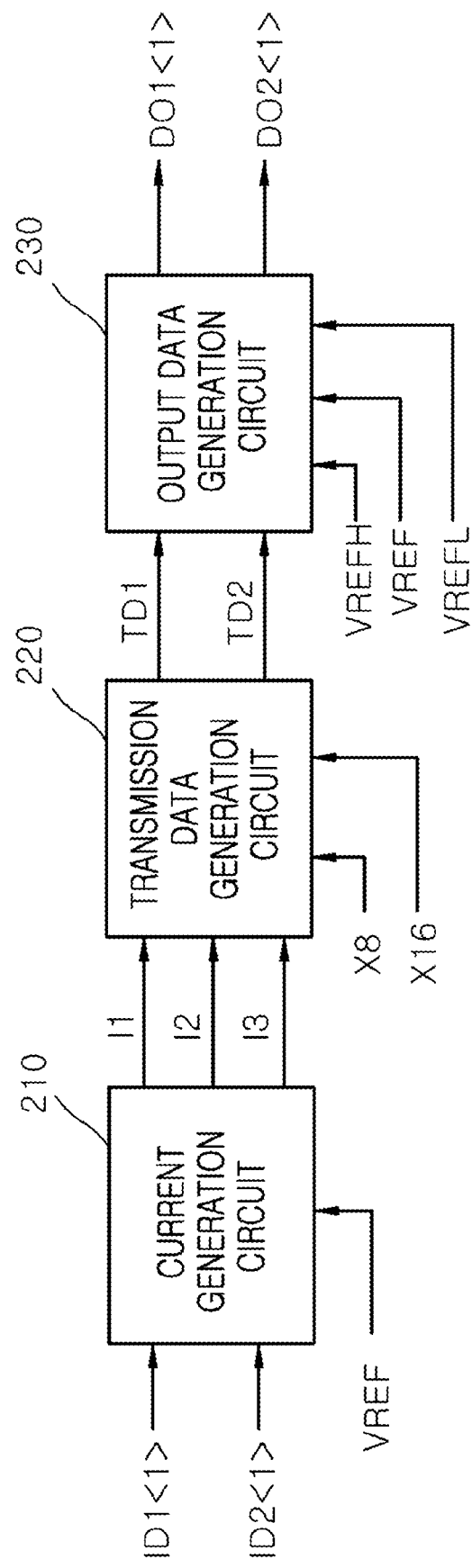
FIG. 3 is a block diagram illustrating a configuration of a first data generation circuit included in the first data output circuit of FIG. 2.

Referring to FIG. 3, the first data generation circuit 21 may include a current generation circuit 210, a transmission data generation circuit 220 and an output data generation circuit 230.

The current generation circuit 210 may compare the first bit datum ID1<1> of the first internal data ID1<1:8> with a reference voltage VREF to generate a first internal current IL. The current generation circuit 210 may generate a second internal current I2 and a third internal current I3, amounts of which are controlled according to a logic level combination of the first bit datum ID1<1> of the first internal data ID1<1:8> and the first bit datum ID2<1> of the second internal data ID2<1:8>. The reference voltage VREF may be a voltage for sensing a logic level of data and may be set to have a constant voltage level.

The transmission data generation circuit 220 may generate a first transmission datum TD1 from a signal of an internal node (NODE of FIG. 5), which is driven by the first internal current I1, in the first mode. The transmission data generation circuit 220 may generate the first transmission datum TD1 from a signal of the internal node (NODE of FIG. 5), which is driven by the first internal current I1, in response to the first mode signal 'x8'. The transmission data generation circuit 220 may generate a second transmission datum TD2 from a signal of the internal node (NODE of FIG. 5), which is driven by the second and third internal currents I2 and I3, in the second mode. The transmission data generation circuit 220 may generate the second transmission datum TD2 from a signal of the internal node (NODE of FIG. 5), which is driven by the second and third internal currents I2 and I3, in response to the second mode signal 'x16'.

The output data generation circuit 230 may compare the first transmission datum TD1 with the reference voltage VREF to generate the first bit datum DO1<1> of the first output data DO1<1:8> in the first mode. The output data generation circuit 230 may compare the second transmission datum TD2 with an upper limited reference voltage VREFH, the reference voltage VREF and a lower limited reference voltage VREFL to generate the first bit datum DO1<1> of the first output data DO1<1:8> and the first bit datum DO2<1> of the second output data DO2<1:8> in the second mode. The upper limited reference voltage VREFH may be set to have a voltage level which is higher than a voltage level of the reference voltage VREF. The lower limited reference voltage VREFL may be set to have a voltage level which is lower than a voltage level of the reference voltage VREF.

Each of the second to eighth data generation circuits 22-28 illustrated in FIG. 2 may be realized using the same circuit as the first data generation circuit 21 described with reference to FIG. 3 except input/output (I/O) signals. Thus, since each of the second to eighth data generation circuits 22-28 performs substantially the same operation as the first data generation circuit 21, detailed descriptions of the second to eighth data generation circuits 22-28 will be omitted hereinafter.

Figure 4:
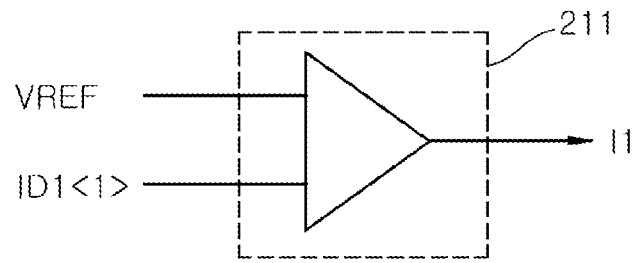
FIG. 4 is a circuit diagram illustrating a configuration of a current generation circuit included in the first data generation circuit of FIG. 3.
Figure 4:
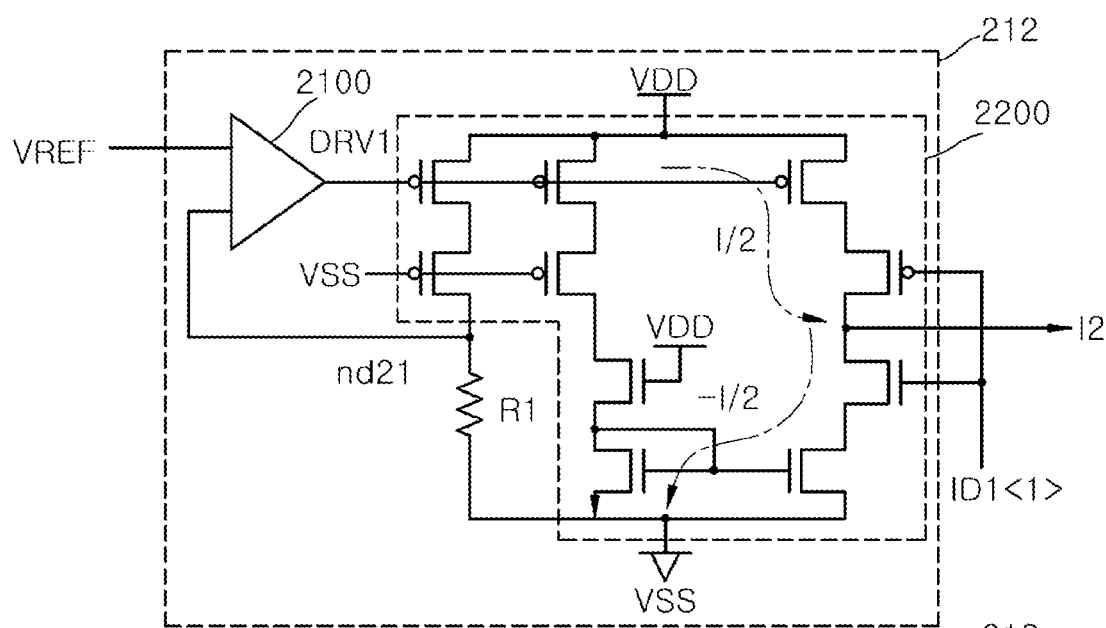
Figure 4:
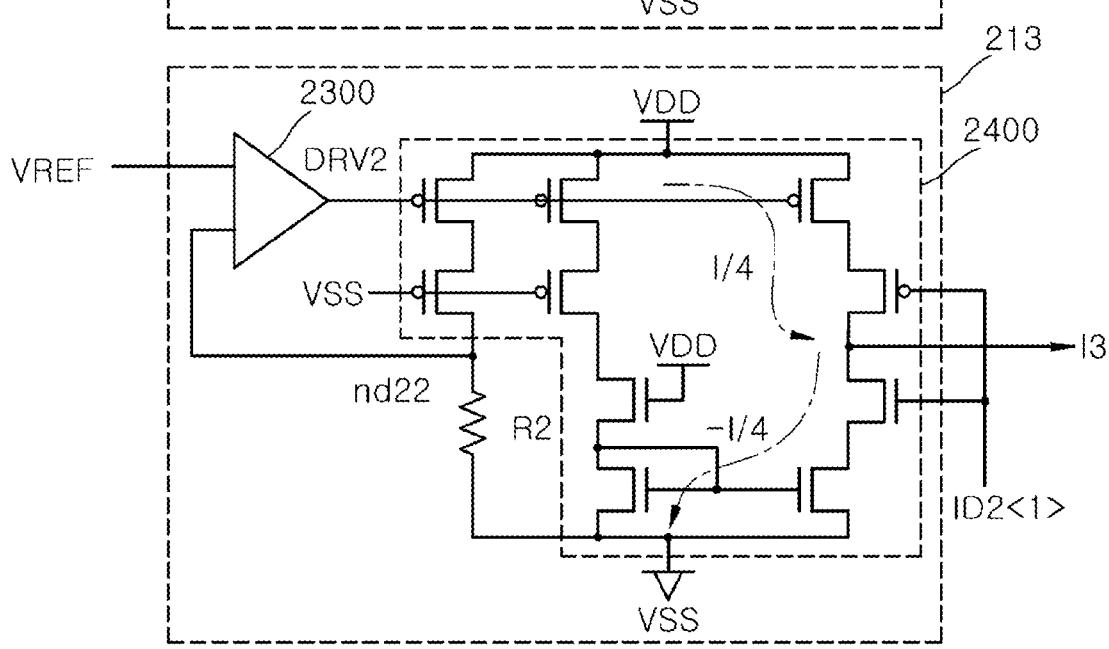

Referring to FIG. 4, the current generation circuit 210 may include a first internal current generation circuit 211, a second internal current generation circuit 212 and a third internal current generation circuit 213.

The first internal current generation circuit 211 may compare the first bit datum ID1<1> of the first internal data ID1<1:8> with the reference voltage VREF to generate the first internal current I1. The first internal current generation circuit 211 may generate the first internal current I1 having a first current amount 'I' if a level of the first bit datum ID1<1> of the first internal data ID1<1:8> is lower than a level of the reference voltage VREF. The first current amount 'I' may be set to be the largest amount among various amounts of the internal currents. The first internal current generation circuit 211 may generate the first internal current I1 having a second current amount '0' if a level of the first bit datum ID1<1> of the first internal data ID1<1:8> is equal to or higher than a level of the reference voltage VREF. The second current amount '0' may be set to be the smallest amount among various amounts of the internal currents.

The second internal current generation circuit 212 may include a first resistor R1, a first comparator 2100 and a first current amount control circuit 2200.

The first resistor R1 may be coupled between a first node nd21 and a ground voltage VSS terminal. The first resistor R1 may be set to have a first resistance value.

The first comparator 2100 may compare a voltage of the first node nd21 with the reference voltage VREF to generate a first voltage signal DRV1. The first comparator 2100 may generate the first voltage signal DRV1 which is enabled to have a logic "low" level if a voltage of the first node nd21 is lower than the reference voltage VREF.

The first current amount control circuit 2200 may drive the first node nd21 to a level of a power supply voltage VDD in response to the first voltage signal DRV1. The first current amount control circuit 2200 may generate the second internal current I2, a current amount of which is controlled according to a logic level of the first bit datum ID1<1> of the first internal data ID1<1:8>. The first current amount control circuit 2200 may generate the second internal current I2 having a third current amount if the first bit datum ID1<1> of the first internal data ID1<1:8> has a logic "low" level. The third current amount may be set to be a half (i.e., ½) of the first current amount 'I'. The first current amount control circuit 2200 may generate the second internal current I2 having a fourth current amount if the first bit datum ID1<1> of the first internal data ID1<1:8> has a logic "high" level. The fourth current amount may be set to have a negative value of a half (i.e., −½) of the first current amount 'I'. That is, an absolute value of the fourth current amount may be equal to the third current amount, and the second internal current I2 having the fourth current amount may flow in an opposite direction to the second internal current I2 having the third current amount.

The third internal current generation circuit 213 may include a second resistor R2, a second comparator 2300 and a second current amount control circuit 2400.

The second resistor R2 may be coupled between a second node nd22 and the ground voltage VSS terminal. The second resistor R2 may be set to have a second resistance value.

The second comparator 2300 may compare a voltage of the second node nd22 with the reference voltage VREF to generate a second voltage signal DRV2. The second comparator 2300 may generate the second voltage signal DRV2 which is enabled to have a logic "low" level if a voltage of the second node nd22 is lower than the reference voltage VREF.

The second current amount control circuit 2400 may drive the second node nd22 to a level of the power supply voltage VDD in response to the second voltage signal DRV2. The second current amount control circuit 2400 may generate the third internal current I3, a current amount of which is controlled according to a logic level of the first bit datum ID2<1> of the second internal data ID2<1:8>. The second current amount control circuit 2400 may generate the third internal current I3 having a fifth current amount if the first bit datum ID2<1> of the second internal data ID2<1:8> has a logic "low" level. The fifth current amount may be set to be a quarter (i.e., ¼) of the first current amount 'I'. The second current amount control circuit 2400 may generate the third internal current I3 having a sixth current amount if the first bit datum ID2<1> of the second internal data ID2<1:8> has a logic "high" level. The sixth current amount may be set to have a negative value of a quarter (i.e., −¼) of the first current amount 'I'. That is, an absolute value of the sixth current amount may be equal to the fifth current amount, and the third internal current I3 having the sixth current amount may flow in an opposite direction to the third internal current I3 having the fifth current amount.

Figure 5:
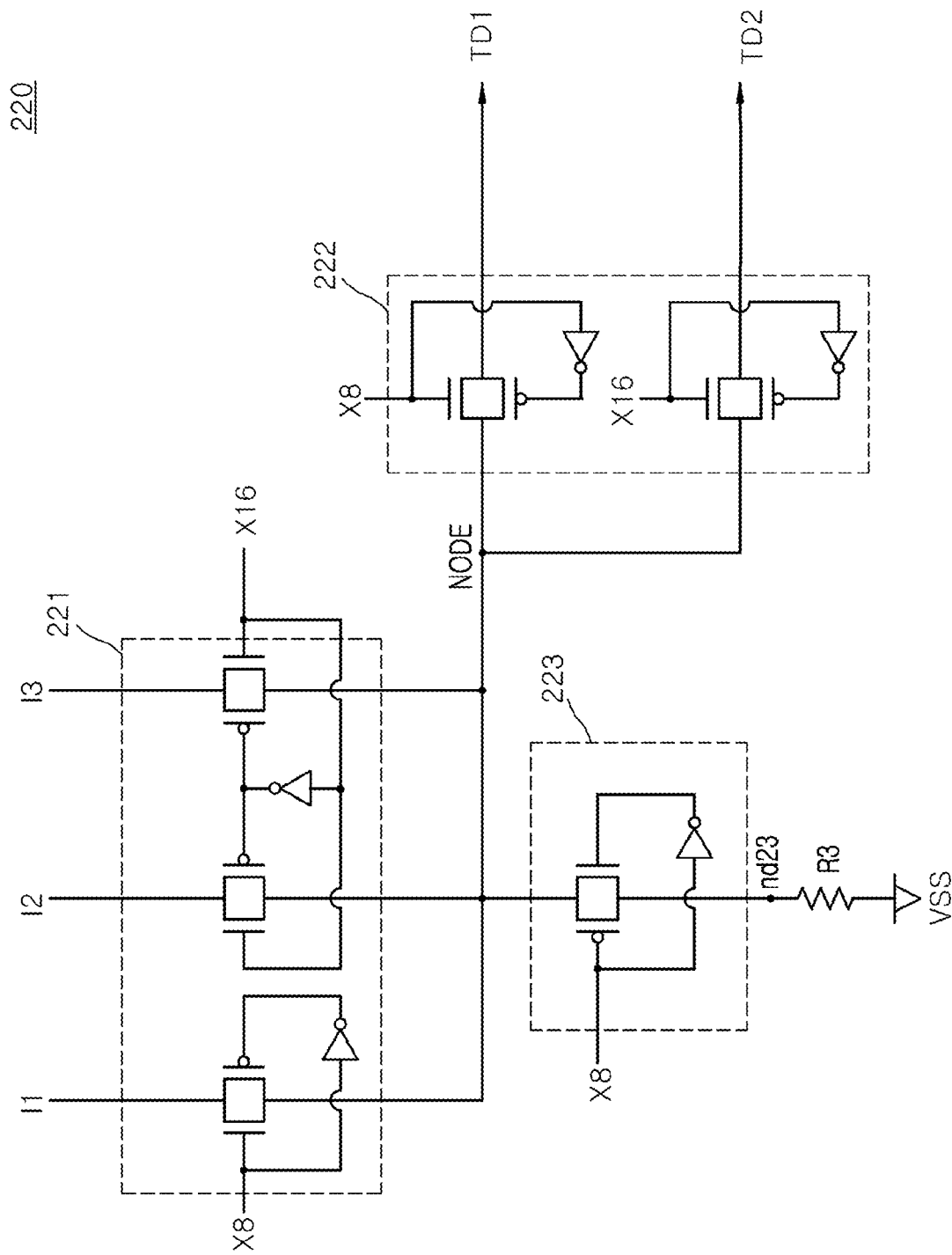
FIG. 5 is a circuit diagram illustrating a configuration of a transmission data generation circuit included in the first data generation circuit of FIG. 3.

Referring to FIG. 5, the transmission data generation circuit 220 may include a first switch circuit 221, a second switch circuit 222, a third switch circuit 223 and a third resistor R3.

The first switch circuit 221 may output the first internal current I1 to the internal node NODE in response to the first mode signal '×8'. The first switch circuit 221 may drive a level of the internal node NODE using an amount of the first internal current I1 if the first mode signal '×8' is enabled to have a logic "high" level. The first switch circuit 221 may output a total current of the second and third internal currents I2 and I3 to the internal node NODE in response to the second mode signal '×16'. The first switch circuit 221 may drive a level of the internal node NODE using a total current of the second and third internal currents I2 and I3 if the second mode signal '×16' is enabled to have a logic "high" level.

The second switch circuit 222 may generate the first transmission datum TD1 having a voltage level of the internal node NODE in response to the first mode signal '×8'. The second switch circuit 222 may generate the first transmission datum TD1 having a voltage level of the internal node NODE if the first mode signal '×8' is enabled to have a logic "high" level. The second switch circuit 222 may generate the second transmission datum TD2 having a voltage level of the internal node NODE in response to the second mode signal '×16'. The second switch circuit 222 may generate the second transmission datum TD2 having a voltage level of the internal node NODE if the second mode signal '×16' is enabled to have a logic "high" level.

The third switch circuit 223 may be coupled between the internal node NODE and a node nd23. The third switch circuit 223 may disconnect the internal node NODE from the node nd23 in response to the first mode signal '×8'. The third switch circuit 223 may disconnect the internal node NODE from the node nd23 if the first mode signal '×8' is enabled to have a logic "high" level.

The third resistor R3 may be coupled between the node nd23 and the ground voltage VSS terminal.

The internal node NODE may be driven by a current supplied by the first switch circuit 221 if the first mode signal '×8' is enabled to have a logic "high" level. The internal node NODE may be set to have a first voltage level corresponding to the product of the current supplied by the first switch circuit 221 by a resistance value of the third resistor R3 if the second mode signal '×16' is enabled to have a logic "high" level.

Figure 6:
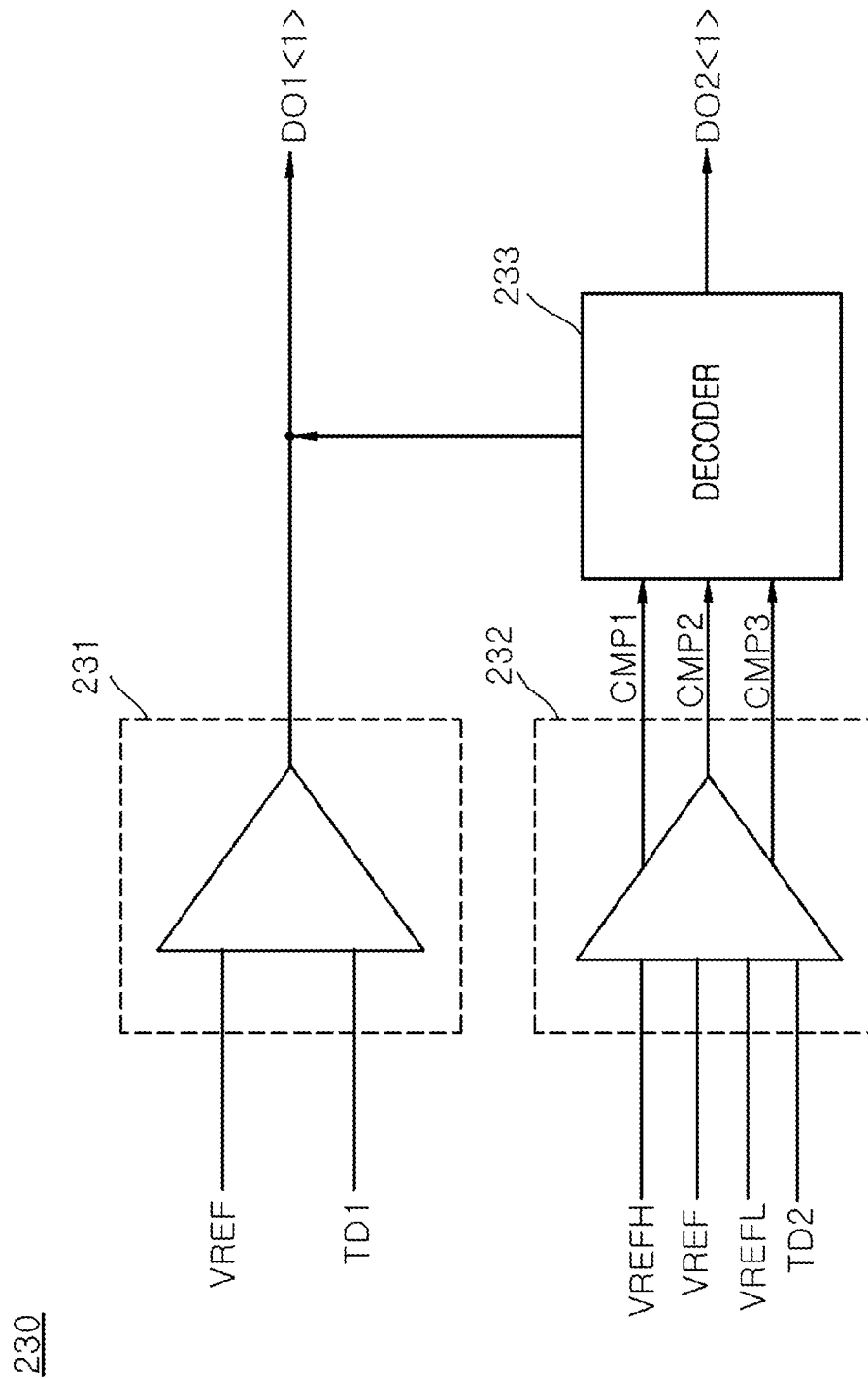
FIG. 6 is a schematic view illustrating a configuration of an output data generation circuit included in the first data generation circuit of FIG. 3.

Referring to FIG. 6, the output data generation circuit 230 may include a first comparison circuit 231, a second comparison circuit 232 and a decoder 233.

The first comparison circuit 231 may compare the first transmission datum TD1 with the reference voltage VREF to generate the first bit datum DO1<1> of the first output data DO1<1:8>. The first comparison circuit 231 may generate the first bit datum DO1<1> having a logic "high" level if a voltage level of the first transmission datum TD1 is lower than the reference voltage VREF. The first comparison circuit 231 may generate the first bit datum DO1<1> having a logic "low" level if a voltage level of the first transmission datum TD1 is higher than the reference voltage VREF.

The second comparison circuit 232 may compare the second transmission datum TD2 with the upper limited reference voltage VREFH, the reference voltage VREF and the lower limited reference voltage VREFL to generate a first comparison signal CMP1, a second comparison signal CMP2 and a third comparison signal CMP3. Operations of the second comparison circuit 232 for generating the first, second and third comparison signals CMP1, CMP2 and CMP3 will be described with reference to FIGS. 7 and 8 later.

The decoder 233 may generate the first bit datum DO1<1> of the first output data DO1<1:8> and the first bit datum DO2<1> of the second output data DO2<1:8> according to a logic level combination of the first, second and third comparison signals CMP1, CMP2 and CMP3. Operations of the decoder 233 for generating the first bit datum DO1<1> of the first output data DO1<1:8> and the first bit datum DO2<1> of the second output data DO2<1:8> will be described with reference to FIG. 8 later.

Figure 7:
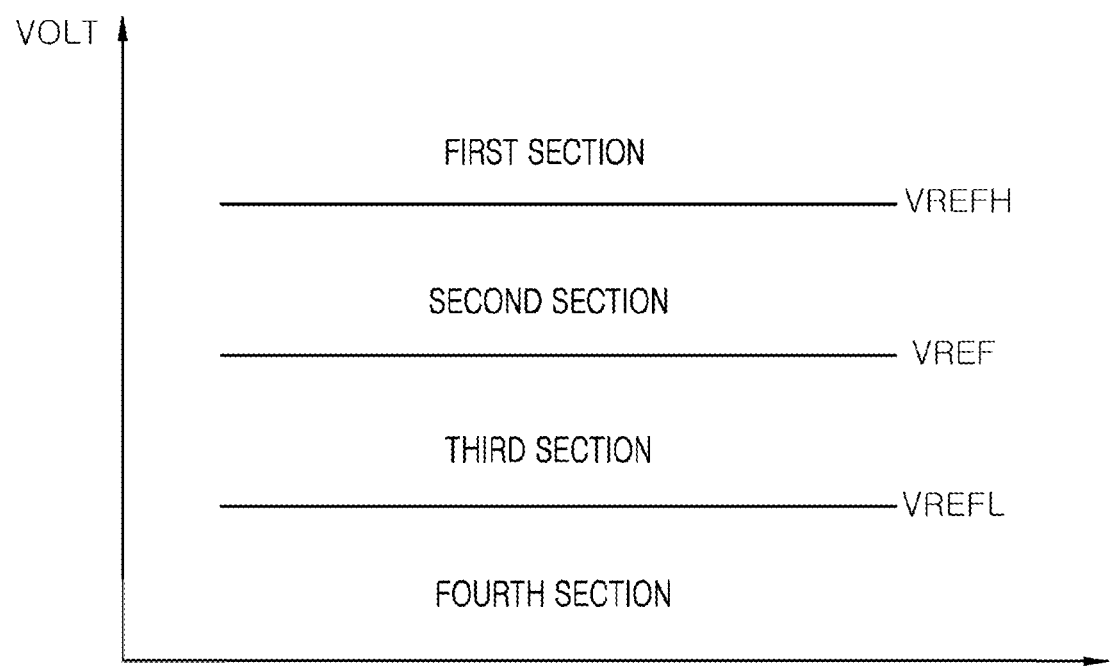

First, operations of the second comparison circuit 232 for generating the first, second and third comparison signals CMP1, CMP2 and CMP3 by comparing the second transmission datum TD2 with the upper limited reference voltage VREFH, the reference voltage VREF and the lower limited reference voltage VREFL will be described hereinafter with reference to FIGS. 7 and 8.

The second comparison circuit 232 may generate the first comparison signal CMP1 having a logic "low(L)" level, the second comparison signal CMP2 having a logic "low(L)" level and the third comparison signal CMP3 having a logic "low(L)" level if a voltage level of the second transmission datum TD2 is within a first section higher than the upper limited reference voltage VREFH.

The second comparison circuit 232 may generate the first comparison signal CMP1 having a logic "high(H)" level, the second comparison signal CMP2 having a logic "low(L)" level and the third comparison signal CMP3 having a logic "low(L)" level if a voltage level of the second transmission datum TD2 is within a second section which is higher than the reference voltage VREF and equal to or lower than the upper limited reference voltage VREFH.

The second comparison circuit 232 may generate the first comparison signal CMP1 having a logic "high(H)" level, the second comparison signal CMP2 having a logic "high(H)" level and the third comparison signal CMP3 having a logic "low(L)" level if a voltage level of the second transmission datum TD2 is within a third section which is higher than the lower limited reference voltage VREFL and equal to or lower than the reference voltage VREF.

The second comparison circuit 232 may generate the first comparison signal CMP1 having a logic "high(H)" level, the second comparison signal CMP2 having a logic "high(H)" level and the third comparison signal CMP3 having a logic "high(H)" level if a voltage level of the second transmission datum TD2 is within a fourth section which is equal to or lower than the lower limited reference voltage VREFL.

Operations of the decoder 233 for generating the first bit datum DO1<1> of the first output data DO1<1:8> and the first bit datum DO2<1> of the second output data DO2<1:8> according to a logic level combination of the first, second and third comparison signals CMP1, CMP2 and CMP3 will be described hereinafter with reference to FIG. 8.

The decoder 233 may generate the first bit datum DO1<1> having a logic "low(L)" level and the first bit datum DO2<1> having a logic "low(L)" level if the first comparison signal CMP1 has a logic "low(L)" level, the second comparison signal CMP2 has a logic "low(L)" level, and the third comparison signal CMP3 has a logic "low(L)" level.

The decoder 233 may generate the first bit datum DO1<1> having a logic "low(L)" level and the first bit datum DO2<1> having a logic "high(H)" level if the first comparison signal CMP1 has a logic "high(H)" level, the second comparison signal CMP2 has a logic "low(L)" level, and the third comparison signal CMP3 has a logic "low(L)" level.

The decoder 233 may generate the first bit datum DO1<1> having a logic "high(H)" level and the first bit datum DO2<1> having a logic "low(L)" level if the first comparison signal CMP1 has a logic "high(H)" level, the second comparison signal CMP2 has a logic "high(H)" level, and the third comparison signal CMP3 has a logic "low(L)" level.

The decoder 233 may generate the first bit datum DO1<1> having a logic "high(H)" level and the first bit datum DO2<1> having a logic "high(H)" level if the first comparison signal CMP1 has a logic "high(H)" level, the second comparison signal CMP2 has a logic "high(H)" level, and the third comparison signal CMP3 has a logic "high(H)" level.

Operations of the semiconductor system having the aforementioned configuration in the first and second modes will be described hereinafter in conjunction with a case that the first memory circuit 10 and the first data output circuit 20 operate in a read mode.

First, an operation for generating the first output data DO1<1:8> from the first internal data ID1<1:8> in the first mode will be described hereinafter in conjunction with an example in which the first bit datum DO1<1> of the first output data DO1<1:8> is generated when the first bit datum ID1<1> of the first internal data ID1<1:8> has a logic "low(L)" level.

The first semiconductor device 1 may output the first mode signal '×8' which is enabled to have a logic "high(H)" level such that the second semiconductor device 2 enters the first mode.

The first memory circuit 10 may output the first internal data ID1<1:8> having the first burst length (BL8) in response to the first mode signal '×8' having a logic "high (H)" level.

The current generation circuit 210 of the first data generation circuit 21 may generate the first internal current I1 having the first current amount 'I' in response to the first bit datum ID1<1> having a logic "low(L)" level.

The transmission data generation circuit 220 of the first data generation circuit 21 may generate the first transmission datum TD1, which is driven by the first internal current I1 having the first current amount 'I', in response to the first mode signal '×8' having a logic "high(H)" level. In such a case, the first transmission datum TD1 may be driven to have a voltage level of a logic "high(H)" level.

The output data generation circuit 230 may compare the first transmission datum TD1 with the reference voltage VREF to generate the first bit datum DO1<1> having a logic "low(L)" level.

Each of operations for generating the second to eighth bit data DO1<2:8> of the first output data DO1<1:8> from the second to eighth bit data ID1<2:8> of the first internal data ID1<1:8> may be the same as the operation for generating the first bit datum DO1<1> of the first output data DO1<1:8> from the first bit datum ID1<1> of the first internal data ID1<1:8>, which is described above. Thus, detailed descriptions of the operations for generating the second to eighth bit data DO1<2:8> of the first output data DO1<1:8> from the second to eighth bit data ID1<2:8> of the first internal data ID1<1:8> will be omitted hereinafter to avoid repeated descriptions.

The first output data DO1<1:8> may be transmitted to the first semiconductor device 1 through the first I/O line IO1.

Next, operations for generating the first output data DO1<1:8> and the second output data DO2<1:8> from the first internal data ID1<1:8> and the second internal data ID2<1:8> in the second mode will be described hereinafter in conjunction with an example in which the first bit datum DO1<1> of the first output data DO1<1:8> and the first bit datum DO2<1> of the second output data DO2<1:8> are generated when the first bit datum ID1<1> of the first internal data ID1<1:8> has a logic "low(L)" level and the first bit datum ID2<1> of the second internal data ID2<1:8> has a logic "high(H)" level.

The first semiconductor device 1 may output the second mode signal 'x16' which is enabled to have a logic "high (H)" level such that the second semiconductor device 2 enters the second mode.

The first memory circuit 10 may output the first internal data ID1<1:8> and the second internal data ID2<1:8>, a sum of which has the second burst length (BL16), in response to the second mode signal 'x16' having a logic "high(H)" level.

The current generation circuit 210 of the first data generation circuit 21 may generate the second internal current I2 having an amount corresponding to half an amount of the first internal current I1 in response to the first bit datum ID1<1> having a logic "low(L)" level. The current generation circuit 210 of the first data generation circuit 21 may also generate the third internal current I3 having an amount corresponding to a negative value of a quarter an amount of the first internal current I1 in response to the first bit datum ID2<1> having a logic "high(H)" level.

The transmission data generation circuit 220 of the first data generation circuit 21 may generate the second transmission datum TD2, which is driven by a total current of the second and third internal currents I2 and I3 having an amount of a quarter the first internal current I1, in response to the second mode signal 'x16' having a logic "high(H)" level. In such a case, the second transmission datum TD2 may be generated to have a voltage level which is within the second section of FIG. 7.

The output data generation circuit 230 may compare the second transmission datum TD2 with the upper limited reference voltage VREFH, the reference voltage VREF and the lower limited reference voltage VREFL to generate the first comparison signal CMP1 having a logic "high(H)" level, the second comparison signal CMP2 having a logic "low(L)" level and the third comparison signal CMP3 having a logic "low(L)" level. The output data generation circuit 230 may also generate the first bit datum DO1<1> having a logic "low(L)" level and the first bit datum DO2<1> having a logic "high(H)" level since the first comparison signal CMP1 has a logic "high(H)" level and both of the second and third comparison signals CMP2 and CMP3 have a logic "low(L)" level.

Operations for generating the second to eighth bit data DO1<2:8> of the first output data DO1<1:8> and the second to eighth bit data DO2<2:8> of the second output data DO2<1:8> from the second to eighth bit data ID1<2:8> of the first internal data ID1<1:8> and the second to eighth bit data ID2<2:8> of the second internal data ID2<1:8> may be the same as the operation for generating the first bit datum DO1<1> of the first output data DO1<1:8> and the first bit datum DO2<1> of the second output data DO2<1:8> from the first bit datum ID1<1> of the first internal data ID1<1:8> and the first bit datum ID2<1> of the second internal data ID2<1:8>, which is described above. Thus, detailed descriptions of the operations for generating the second to eighth bit data DO1<2:8> of the first output data DO1<1:8> and the second to eighth bit data DO2<2:8> of the second output data DO2<1:8> from the second to eighth bit data ID1<2:8> of the first internal data ID1<1:8> and the second to eighth bit data ID2<2:8> of the second internal data ID2<1:8> will be omitted hereinafter to avoid repeated descriptions.

The first output data DO1<1:8> may be transmitted to the first semiconductor device 1 through the first I/O line IO1, and the second output data DO2<1:8> may be transmitted to the first semiconductor device 1 through the second I/O line 102.

As described above, the semiconductor system according to an embodiment may output the data using shared I/O lines in both of the first and second modes having different burst lengths. Thus, even though an operation mode of the semiconductor system changes, no additional I/O line is required to prevent a layout area of the semiconductor system from increasing.

Figure 9:
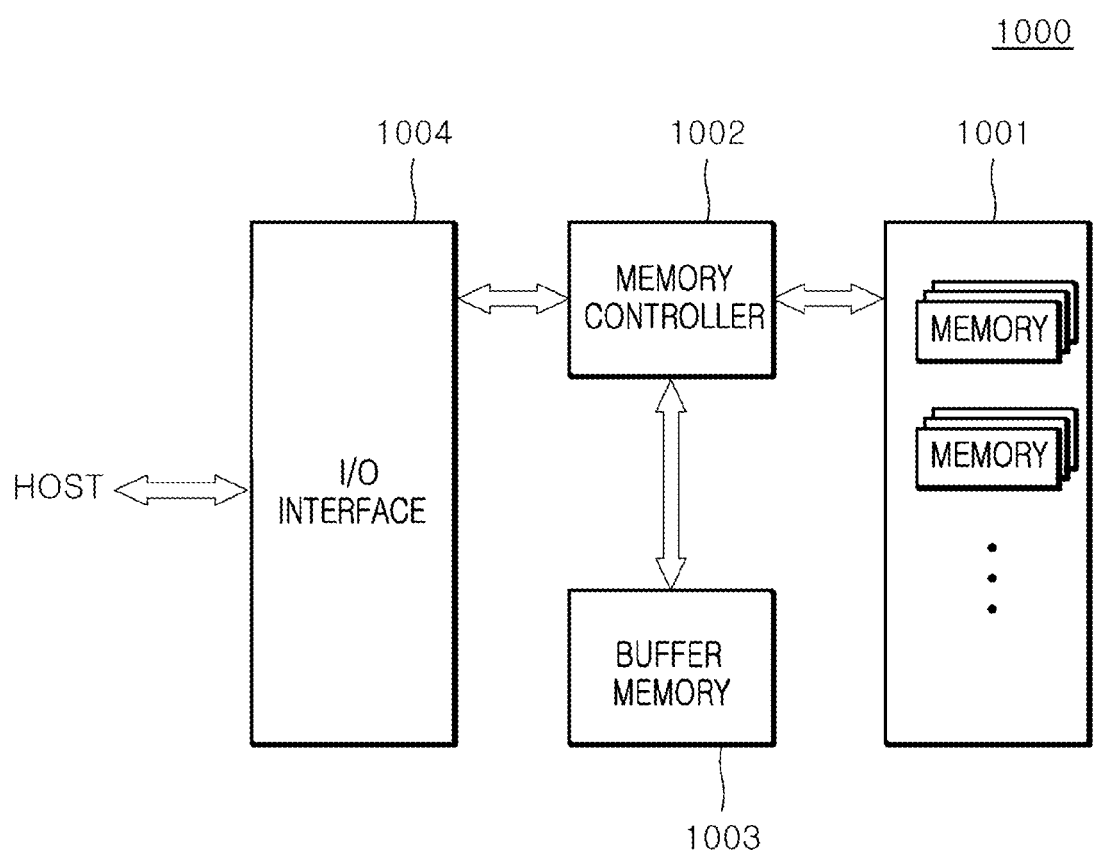
FIG. 9 is a block diagram illustrating a configuration of an electronic system employing the semiconductor system described with reference to FIGS. 1 to 8.

The semiconductor system described with reference to FIGS. 1 to 8 may be applied to an electronic system that includes a memory system, a graphic system, a computing system, a mobile system, or the like. For example, as illustrated in FIG. 9, an electronic system 1000 according an embodiment may include a data storage circuit 1001, a memory controller 1002, a buffer memory 1003, and an input/output (I/O) interface 1004.

The data storage circuit 1001 may store data which are outputted from the memory controller 1002 or may read and output the stored data to the memory controller 1002, according to a control signal outputted from the memory controller 1002. The data storage circuit 1001 may include the second semiconductor device 2 illustrated in FIG. 1. Meanwhile, the data storage circuit 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. The memory controller 1002 may include the first semiconductor device 1 illustrated in FIG. 1. Although FIG. 9 illustrates the memory controller 1002 with a single block, the memory controller 1002 may include one controller for controlling the data storage circuit 1001 comprised of a nonvolatile memory and another controller for controlling the buffer memory 1003 comprised of a volatile memory.

The buffer memory 1003 may temporarily store the data to be processed by the memory controller 1002. That is, the buffer memory 1003 may temporarily store the data which are outputted from or to be inputted to the data storage circuit 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data generated from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB) drive, a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB drive, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:

1. A semiconductor device comprising:
   a memory circuit configured to output first internal data having a first burst length in a first mode and configured to output the first internal data and second internal data in a second mode, wherein a sum of the first and second internal data has a second burst length; and
   a data output circuit configured to output the first internal data as first output data through a first input and output (I/O) line in the first mode and configured to output the first internal data as the first output data through the first I/O line and to output the second internal data as second output data through a second I/O line in the second mode,
   wherein the data output circuit controls an internal current according to a logic level combination of the first and second internal data to generate the first and second output data in the second mode.

2. The semiconductor device of claim 1, wherein the data output circuit controls an internal current according to a logic level of the first internal data to generate the first output data in the first mode.

3. The semiconductor device of claim 1, wherein the second burst length is set to be greater than the first burst length.

4. The semiconductor device of claim 3, wherein the second burst length is set to be twice the first burst length.

5. The semiconductor device of claim 1,
   wherein the internal current includes a first internal current, a second internal current and a third internal current; and
   wherein the data output circuit includes:
   a current generation circuit configured to compare the first internal data with a reference voltage to generate the first internal current and configured to generate the second internal current and the third internal current according to a logic level combination of the first internal data and the second internal data;
   a transmission data generation circuit configured to generate a first transmission datum from a signal of an internal node driven by the first internal current based on a first mode signal and configured to generate a second transmission datum from a signal of the internal node driven by the second and third internal currents based on a second mode signal; and
   an output data generation circuit configured to compare the first transmission datum with the reference voltage to generate the first output data and configured to compare the second transmission datum with an upper limited reference voltage, the reference voltage and a lower limited reference voltage to generate the first output data and the second output data.

6. The semiconductor device of claim 5, wherein the current generation circuit includes:

a first internal current generation circuit configured to compare the first internal data with the reference voltage to generate the first internal current;
   a second internal current generation circuit configured to compare the first internal data with the reference voltage to generate the second internal current, wherein an amount of the second internal current is controlled according to a logic level of the first internal data; and
   a third internal current generation circuit configured to compare the second internal data with the reference voltage to generate the third internal current, wherein an amount of the third internal current is controlled according to a logic level of the second internal data.

7. The semiconductor device of claim 6, wherein the second internal current generation circuit includes:
   a first resistor coupled between a first node and a ground voltage terminal;
   a first comparator configured to compare a voltage of the first node with the reference voltage to generate a first voltage signal; and
   a first current amount control circuit configured to drive the first node based on the first voltage signal and configured to generate the second internal current having a current amount controlled according to a logic level of the first internal data.

8. The semiconductor device of claim 6, wherein the third internal current generation circuit includes:
   a second resistor coupled between a second node and the ground voltage terminal;
   a second comparator configured to compare a voltage of the second node with the reference voltage to generate a second voltage signal; and
   a second current amount control circuit configured to drive the second node based on the second voltage signal and configured to generate the third internal current having a current amount controlled according to a logic level of the second internal data.

9. The semiconductor device of claim 5, wherein the transmission data generation circuit includes:
   a first switch circuit configured to drive a level of the internal node using an amount of the first internal current based on the first mode signal and configured to drive a level of the internal node using a total current of the second and third internal currents based on the second mode signal;
   a second switch circuit configured to generate the first transmission datum having a voltage level of the internal node based on the first mode signal and configured to generate the second transmission datum having a voltage level of the internal node based on the second mode signal;
   a third switch circuit configured to disconnect the internal node from a first node based on the first mode signal; and
   a third resistor coupled between the first node and a ground voltage terminal.

10. The semiconductor device of claim 5, wherein the output data generation circuit includes:
    a first comparison circuit configured to compare the first transmission datum with the reference voltage to generate the first output data;
    a second comparison circuit configured to compare the second transmission datum with the upper limited reference voltage, the reference voltage, and the lower limited reference voltage to generate a first comparison signal, a second comparison signal, and a third comparison signal; and a decoder configured to generate the first output data and the second output data according to a logic level combination of the first, second and third comparison signals.

11. A semiconductor system comprising:
a first semiconductor device configured to output a first mode signal and a second mode signal and configured to receive data loaded on a first input and output (I/O) line and a second I/O line; and
a second semiconductor device configured to output first internal data as first output data through the first I/O line based on the first mode signal and configured to output the first internal data as the first output data through the first I/O line and to output second internal data as second output data through the second I/O line based on the second mode signal,
wherein the second semiconductor device controls an internal current according to a logic level combination of the first and second internal data to generate the first and second output data if the second mode signal is enabled.

12. The semiconductor system of claim 11, wherein the second semiconductor device controls an internal current according to a logic level of the first internal data to generate the first output data if the first mode signal is enabled.

13. The semiconductor system of claim 11, wherein the first output data are transmitted to the first semiconductor device through the first I/O line, and the second output data are transmitted to the first semiconductor device through the second I/O line.

14. The semiconductor system of claim 11, wherein the first mode signal is enabled in a first mode that the first output data are outputted with a first burst length, and the second mode signal is enabled in a second mode that total data of the first and second output data are outputted with a second burst length.

15. The semiconductor system of claim 14, wherein the second burst length is set to be greater than the first burst length.

16. The semiconductor system of claim 12, wherein the second burst length is set to be twice the first burst length.

17. The semiconductor system of claim 11, wherein the second semiconductor device includes:
a first memory circuit configured to output the first internal data based on the first mode signal and configured to output the first internal data and the second internal data based on the second mode signal; and
a first data output circuit configured to output the first internal data as the first output data based on the first mode signal and configured to output the first internal data as the first output data and to output the second internal data as the second output data based on the second mode signal.

18. The semiconductor system of claim 17, wherein the first data output circuit controls an internal current according to a logic level combination of the first and second internal data to generate the first and second output data based on the second mode signal.

19. The semiconductor system of claim 17,
wherein the internal current includes a first internal current, a second internal current, and a third internal current; and
wherein the first data output circuit includes:
a first current generation circuit configured to compare the first internal data with a reference voltage to generate the first internal current and configured to generate the second internal current and the third internal current according to a logic level combination of the first internal data and the second internal data;
a first transmission data generation circuit configured to generate a first transmission datum from a signal of an internal node driven by the first internal current based on the first mode signal and configured to generate a second transmission datum from a signal of the internal node driven by the second and third internal currents based on the second mode signal; and
a first output data generation circuit configured to compare the first transmission datum with the reference voltage to generate the first output data and configured to compare the second transmission datum with an upper limited reference voltage, the reference voltage and a lower limited reference voltage to generate the first output data and the second output data.

20. The semiconductor system of claim 19, wherein the first current generation circuit includes:
a first internal current generation circuit configured to compare the first internal data with the reference voltage to generate the first internal current;
a second internal current generation circuit configured to compare the first internal data with the reference voltage to generate the second internal current, wherein an amount of the second internal current is controlled according to a logic level of the first internal data; and
a third internal current generation circuit configured to compare the second internal data with the reference voltage to generate the third internal current, wherein an amount of the third internal current is controlled according to a logic level of the second internal data.

21. The semiconductor system of claim 19, wherein the first transmission data generation circuit includes:
a first switch circuit configured to drive a level of the internal node using an amount of the first internal current based on the first mode signal and configured to drive a level of the internal node using a total current of the second and third internal currents based on the second mode signal;
a second switch circuit configured to generate the first transmission datum having a voltage level of the internal node based on the first mode signal and configured to generate the second transmission datum having a voltage level of the internal node based on the second mode signal;
a third switch circuit configured to disconnect the internal node from a first node based on the first mode signal; and
a first resistor coupled between the first node and a ground voltage terminal.

22. The semiconductor system of claim 19, wherein the first output data generation circuit includes:
a first comparison circuit configured to compare the first transmission datum with the reference voltage to generate the first output data;
a second comparison circuit configured to compare the second transmission datum with the upper limited reference voltage, the reference voltage and the lower limited reference voltage to generate a first comparison signal, a second comparison signal and a third comparison signal; and
a first decoder configured to generate the first output data and the second output data according to a logic level combination of the first, second and third comparison signals.

23. The semiconductor system of claim 17, wherein the second semiconductor device further includes:

a second memory circuit configured to output third internal data based on the first mode signal and configured to output the third internal data and fourth internal data based on the second mode signal; and a second data output circuit configured to output the third internal data as third output data based on the first mode signal and configured to output the third internal data as the third output data and to output the fourth internal data as fourth output data based on the second mode signal.

24. The semiconductor system of claim 23, wherein the third output data are transmitted to the first semiconductor device through the first I/O line, and the fourth output data are transmitted to the first semiconductor device through the second I/O line.

25. The semiconductor system of claim 23, wherein the second data output circuit controls the internal current according to a logic level combination of the third and fourth internal data to generate the third and fourth output data based on the second mode signal.

26. The semiconductor system of claim 23,
wherein the internal current includes a fourth internal current, a fifth internal current and a sixth internal current; and
wherein the second data output circuit includes:
a second current generation circuit configured to compare the third internal data with a reference voltage to generate the fourth internal current and configured to generate the fifth internal current and the sixth internal current according to a logic level combination of the third internal data and the fourth internal data;
a second transmission data generation circuit configured to generate a third transmission datum from a signal of an internal node driven by the fourth internal current based on the first mode signal and configured to generate a fourth transmission datum from a signal of the internal node driven by the fifth and sixth internal currents based on the second mode signal; and
a second output data generation circuit configured to compare the third transmission datum with the reference voltage to generate the third output data and configured to compare the fourth transmission datum with an upper limited reference voltage, the reference voltage and a lower limited reference voltage to generate the third output data and the fourth output data.

27. The semiconductor system of claim 26, wherein the second current generation circuit includes:

a fourth internal current generation circuit configured to compare the third internal data with the reference voltage to generate the fourth internal current;
a fifth internal current generation circuit configured to compare the third internal data with the reference voltage to generate the fifth internal current, wherein an amount of the fifth internal current is controlled according to a logic level of the third internal data; and
a sixth internal current generation circuit configured to compare the fourth internal data with the reference voltage to generate the sixth internal current, wherein an amount of the sixth internal current is controlled according to a logic level of the fourth internal data.

28. The semiconductor system of claim 26, wherein the second transmission data generation circuit includes:
a fourth switch circuit configured to drive a level of the internal node using an amount of the fourth internal current based on the first mode signal and configured to drive a level of the internal node using a total current of the fifth and sixth internal currents based on the second mode signal;
a fifth switch circuit configured to generate the third transmission datum having a voltage level of the internal node based on the first mode signal and configured to generate the fourth transmission datum having a voltage level of the internal node based on the second mode signal;
a sixth switch circuit configured to disconnect the internal node from a second node based on the first mode signal; and
a second resistor coupled between the second node and a ground voltage terminal.

29. The semiconductor system of claim 26, wherein the second output data generation circuit includes:
a third comparison circuit configured to compare the third transmission datum with the reference voltage to generate the third output data;
a fourth comparison circuit configured to compare the fourth transmission datum with the upper limited reference voltage, the reference voltage and the lower limited reference voltage to generate a fourth comparison signal, a fifth comparison signal, and a sixth comparison signal; and
a second decoder configured to generate the third output data and the fourth output data according to a logic level combination of the fourth, fifth, and sixth comparison signals.

* * * * *